United States Patent
Yang et al.

(10) Patent No.: US 7,833,837 B2
(45) Date of Patent: Nov. 16, 2010

(54) CHIP SCALE PACKAGE AND METHOD FOR MANUFACTURING THE SAME

(75) Inventors: Jun Young Yang, Kaohsiung (TW); You Ock Joo, Kaohsiung (TW); Dong Pil Jung, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 677 days.

(21) Appl. No.: 11/757,795

(22) Filed: Jun. 4, 2007

(65) Prior Publication Data

US 2008/0032452 A1 Feb. 7, 2008

Related U.S. Application Data

(62) Division of application No. 11/047,617, filed on Feb. 2, 2005, now abandoned.

(51) Int. Cl.
*H01L 21/00* (2006.01)
(52) U.S. Cl. ........................ 438/119; 438/113; 438/458; 438/613; 257/E23.02; 257/E23.021; 257/E23.069
(58) Field of Classification Search ................. 438/113, 438/118, 458, 119, 613; 257/E23.02, E23.021, 257/E23.069
See application file for complete search history.

(56) References Cited

U.S. PATENT DOCUMENTS

| | | | | |
|---|---|---|---|---|
| 5,677,576 | A | * 10/1997 | Akagawa | .................... 257/785 |
| 6,228,687 | B1 | 5/2001 | Akram | |
| 7,364,983 | B2 * | 4/2008 | Wang et al. | ................. 438/458 |
| 2002/0098620 | A1 | 7/2002 | Ding | |

* cited by examiner

*Primary Examiner*—Mary Wilczewski
*Assistant Examiner*—Toniae M Thomas
(74) *Attorney, Agent, or Firm*—Muncy, Geissler, Olds & Lowe, PLLC (57) ABSTRACT

A chip scale package includes a patterned circuit layer attached to the active surface of a semiconductor chip through an anisotropic conductive adhesive layer such that contact pads on a lower surface of the patterned circuit layer are electrically coupled to corresponding bonding pads on the semiconductor chip. The patterned circuit layer has a plurality of openings formed therein at locations corresponding to the contact pads such that each of the contact pads has a portion exposed from an upper surface of the patterned circuit layer through the corresponding opening. A plurality of metal bumps are respectively disposed in the openings and mounted to the exposed portions of the contact pads for making external electrical connection. The present invention further provides a method for manufacturing the chip scale package at the wafer-level.

17 Claims, 8 Drawing Sheets

CHIP SCALE PACKAGE AND METHOD FOR MANUFACTURING THE SAME

CROSS REFERENCE TO RELATED APPLICATION

This application is a divisional application and claims priority to U.S. patent application Ser. No. 11/047,617 filed Feb. 2, 2005, now abandoned, the entire contents of which are incorporated by reference herein.

BACKGROUND OF THE INVENTION

1. Field of the Invention

This invention relates to a chip scale package (CSP), and more specifically to a method of making the chip scale package at the wafer level.

2. Description of the Related Art

As electronic devices have become smaller and thinner, the velocity and the complexity of IC chip become higher and higher. Accordingly, a need has arisen for higher package efficiency. Demand for miniaturization is the primary catalyst driving the usage of advanced packages such as chip scale packages (CSP) and flip chips. Both of them greatly reduce the amount of board real estate required when compared to the alternative ball grid array (BGA) and thin small outline package (TSOP). Typically, a CSP is 20 percent larger than the chip itself. The most obvious advantage of CSP is the size of the package; that is, the package is slightly larger than the chip. Another advantage of CSP is that the package facilitates test and burn-in before assembly as an alternative to known good die (KGD) testing. In addition, CSP can combine many of the benefits of surface mount technology (SMT), such as standardization, encapsulation, surface mount, and reworkability, with the benefits of flip chip technology, such as low inductance, high I/O count, and direct thermal path. However, CSP has at least one disadvantage compared to conventional BGA and TSOP, namely, high cost per unit.

SUMMARY OF THE INVENTION

It is therefore an object of the present invention to provide a low-cost chip scale package.

It is another object of the present invention to provide a low-cost method of manufacturing chip scale packages at the wafer-level.

A chip scale package having features of the present invention generally includes a patterned circuit layer attached to the active surface of a semiconductor chip through an anisotropic conductive adhesive layer such that contact pads on a lower surface of the patterned circuit layer are electrically coupled to corresponding bonding pads on the semiconductor chip. The patterned circuit layer has a plurality of openings formed therein at locations corresponding to the contact pads such that each of the contact pads has a portion exposed from an upper surface of the patterned circuit layer through the corresponding opening. A plurality of metal bumps are respectively disposed in the openings of the patterned circuit layer and mounted to the exposed portions of the contact pads of the patterned circuit layer for making external electrical connection.

The contact pads may be formed at locations corresponding to the bonding pads on the semiconductor chip, and the contact pads of the patterned circuit layer are electrically coupled to the corresponding bonding pads on the semiconductor chip only through conductive particles provided in the anisotropic conductive adhesive layer. Alternatively, the contact pads may be formed as a part of a conductive patterned layer to redistribute the bonding pads 122 into a desired format. The conductive patterned layer may include a plurality of conductive traces each having a first end portion formed at a location corresponding to one of the bonding pads on the semiconductor chip and a second end portion serving as the contact pad, and the contact pads of the patterned circuit layer are electrically coupled to the corresponding bonding pads on the semiconductor chip only through conductive particles provided in the anisotropic conductive adhesive layer and the conductive traces.

According to another aspect of the invention, there is provided another chip scale package in which the patterned circuit layer has a plurality of contact pads on the lower surface thereof and a plurality of solder pads on the upper surface thereof wherein the contact pads of the patterned circuit layer are electrically coupled to corresponding bonding pads on the semiconductor chip only through the conductive particles provided in the anisotropic conductive adhesive layer, and the metal bumps are respectively mounted to the solder pads of the patterned circuit layer for making external electrical connection.

The chip-sized packages of the present invention can be mass produced easily at the wafer-level thereby significantly reducing the manufacturing cost. Specifically, the method for manufacturing chip scale packages at the wafer-level comprises steps of: (a) forming an anisotropic conductive adhesive layer onto the active surface of the wafer; (b) attaching a patterned circuit layer including a plurality of contact pads onto the wafer through the anisotropic conductive adhesive layer such that the contact pads are electrically coupled to corresponding bonding pads on the semiconductor chip; (c) forming a plurality of metal bumps in the openings and mounted to the contact pads; and (d) conducting a cutting step to obtain individual chip scale packages. The metal bumps may be formed by a solder-ball placing step and a reflowing step. Alternatively, the metal bumps may be formed by a solder paste stencil printing step and a reflowing step.

BRIEF DESCRIPTION OF THE DRAWINGS

These and other features, aspects, and advantages of the present invention will be more fully understood by reading the following detailed description of the preferred embodiment, with reference made to the accompanying drawings as follows.

DETAILED DESCRIPTION OF THE PREFERRED EMBODIMENT

Figure 7:
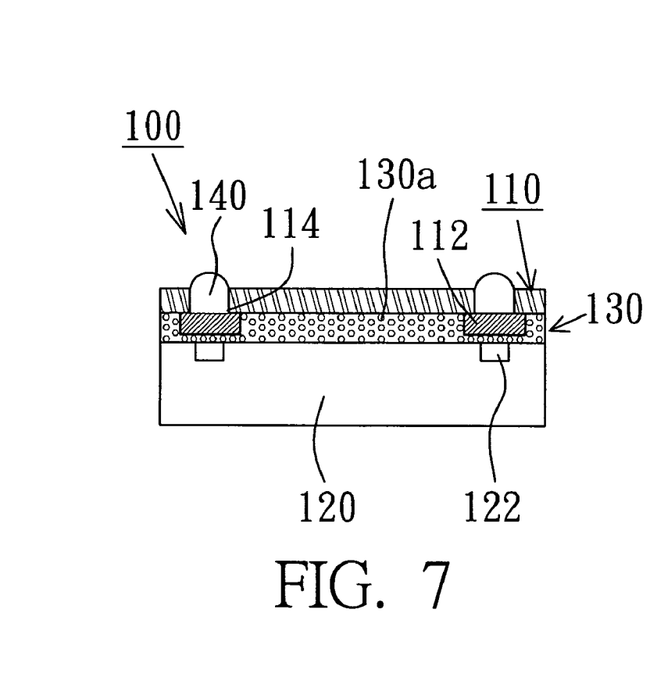
FIG. 7 is a cross sectional view of a chip scale package (CSP) according to one embodiment of the present invention.

FIG. 7 shows a chip scale package (CSP) 100 according to one embodiment of the present invention. The CSP 100 mainly comprises a patterned circuit layer 110 attached to the active surface of a semiconductor chip 120 through an anisotropic conductive adhesive layer 130. The patterned circuit layer 110 has a plurality of contact pads 112 on the lower surface thereof and a plurality of openings 114 formed therein at locations corresponding to the contact pads 112. Note that each contact pad 112 has a portion exposed from the upper surface of the patterned circuit layer 110 through the corresponding opening 114. As shown, a plurality of metal bumps such as solder bumps 140 are respectively disposed in the openings 114 of the patterned circuit layer 110 and mounted to the exposed portions of the contact pads 112 of the patterned circuit layer for making external electrical connection. The semiconductor chip 120 has a plurality of bonding pads 122 formed on the active surface thereof for access to its inner circuits. One type of anisotropic adhesive suitable for forming the anisotropic conductive adhesive layer 130 is known as a "z-axis anisotropic adhesive". Z-axis anisotropic adhesive are filled with conductive particles 130a to a low level such that the particles do not contact each other in the xy plane. Therefore, compression of the Z-axis anisotropic adhesive in the z direction establishes an electrical path between the contact pads 112 of the patterned circuit layer 110 and the corresponding bonding pads 122 on the semiconductor chip 120.

Figure 8:
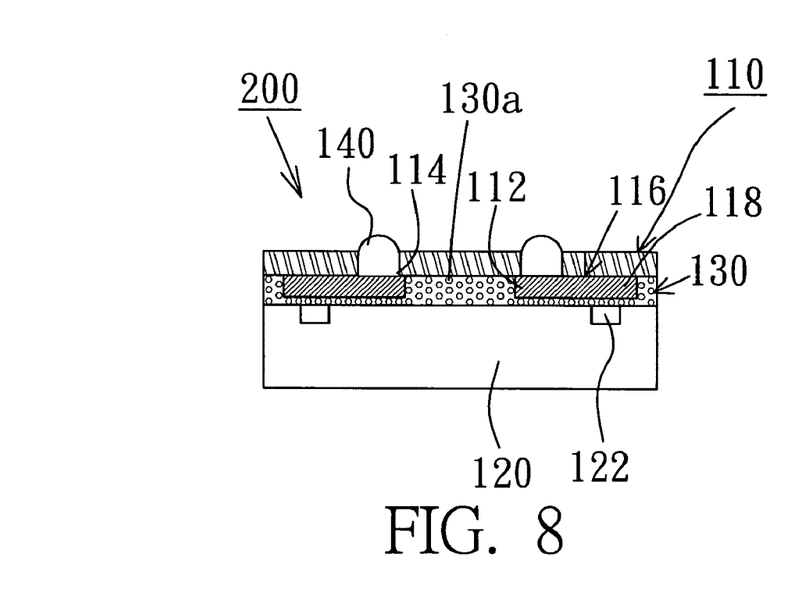
FIG. 8 is a cross sectional view of a chip scale package (CSP) according to another embodiment of the present invention.

FIG. 8 shows a chip scale package (CSP) 200 according to another embodiment of the present invention. The CSP 200 is substantially identical to the CSP 100 of FIG. 7 with the exception that the lower surface of the patterned circuit layer 110 is provided with a plurality of conductive traces 116 each having a first end portion 118 formed at a location corresponding to one of the bonding pads 122 on the semiconductor chip 120 and a second end portion serving as the contact pad 112. It could be understood that the conductive traces 116 is a part of a conductive patterned layer to redistribute the bonding pads 122 into a desired format. In this embodiment, the contact pads 112 of the patterned circuit layer 110 are electrically coupled to the corresponding bonding pads 122 on the semiconductor chip 120 only through the conductive particles 130a and the conductive traces 116.

Figure 9:
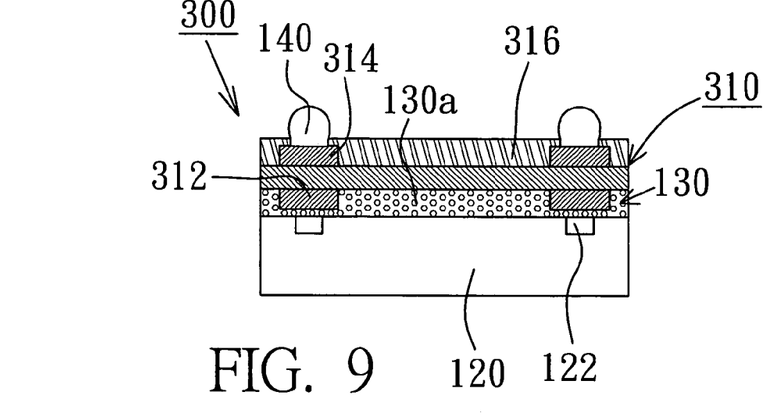
FIG. 9 is a cross sectional view of a chip scale package (CSP) according to another embodiment of the present invention.

FIG. 9 shows a chip scale package (CSP) 300 according to another embodiment of the present invention. The CSP 300 is substantially identical to the CSP 100 of FIG. 7 with the exception that the patterned circuit layer 110 is replaced by a patterned circuit layer 310. The lower surface of the patterned circuit layer 310 is provided with a plurality of contact pads 312. The upper surface of the patterned circuit layer 310 is provided with a plurality of solder pads 314 adapted and is covered by a solder mask 316 in a manner that each of the solder pads 314 has a portion exposed through the solder mask for mounting the solder bump 140. The contact pads 312 on the lower surface of the patterned circuit layer 310 are electrically coupled to corresponding solder pads 314 through conductive lines (not shown) formed in the patterned circuit layer 310. The patterned circuit layer 310 for use with the invention can include any number of layers of conductor circuits if desired. Preferably, the patterned circuit layer 310 is a BGA patterned circuit layer formed by any of a number of build-up technologies. The patterned circuit layer 310 may be formed from a core layer made of fiberglass reinforced BT (bismaleimide-triazine) resin or FR-4 fiberglass reinforced epoxy resin. Note the CSP 300 is a package with I/O redistribution implemented at the wafer level.

FIGS. 1-6 illustrate a method for manufacturing chip scale packages at the wafer-level according to one embodiment of the present invention.

Figure 1:
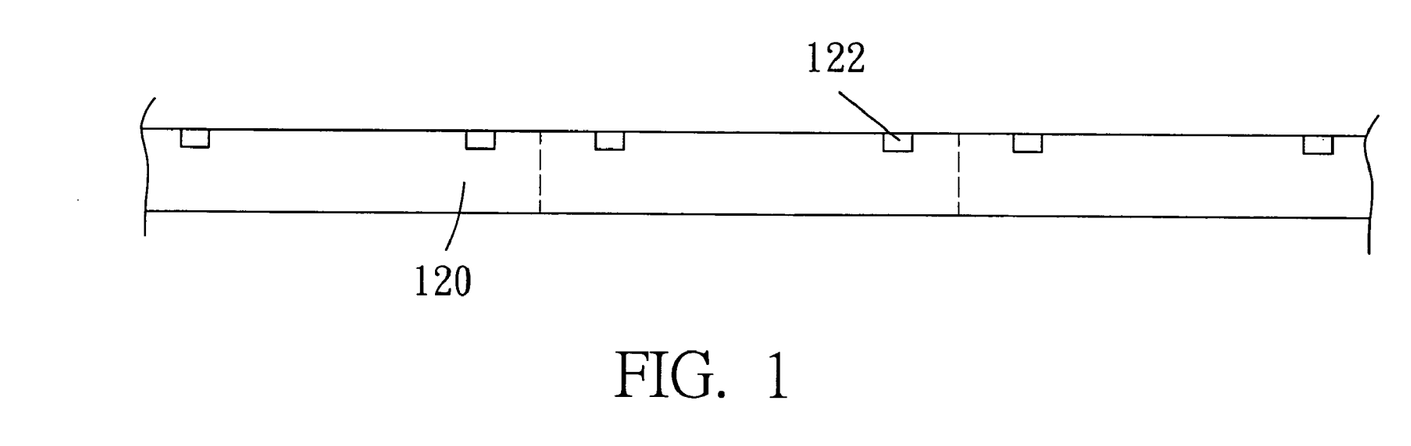
FIGS. 1 to 6 illustrate in cross-section major steps of fabrication of chip scale packages at the wafer-level according to one embodiment of the present invention.

FIG. 1 shows a wafer includes a plurality of semiconductor chips 120 (only three chips are shown in FIG. 1) wherein each semiconductor chip 120 has a plurality of bonding pads 122 on an active surface thereof.

Figure 2:
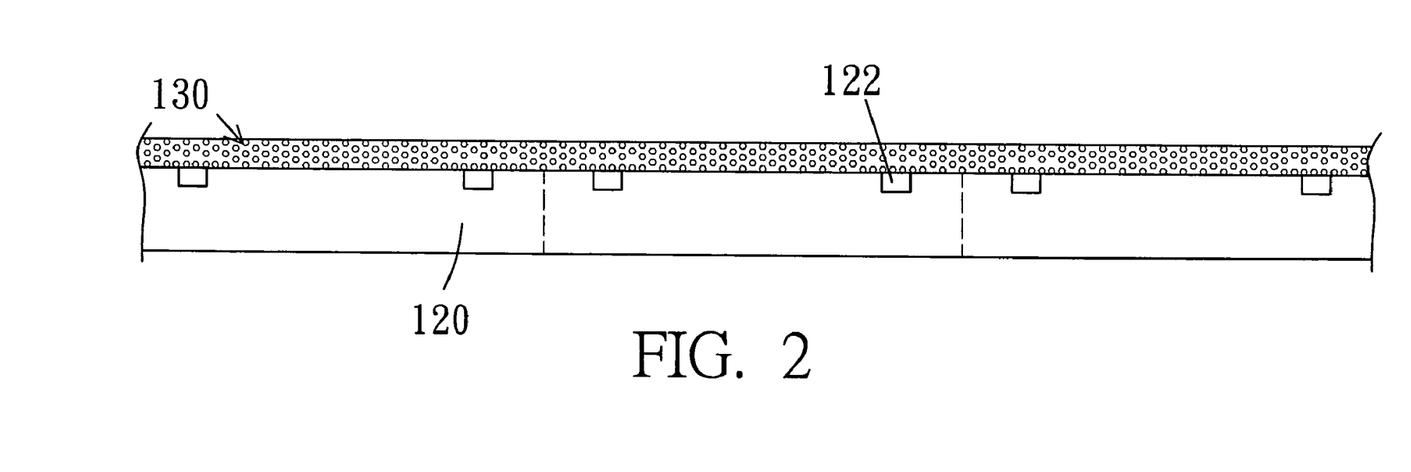

Referring to FIG. 2, an anisotropic conductive adhesive layer 130 is formed onto the active surface of the wafer. There are two types of anisotropic conductive material, a film type (ACF: Anisotropic Conductive Film) and a paste type (ACP: Anisotropic Conductive Paste).

Figure 3:
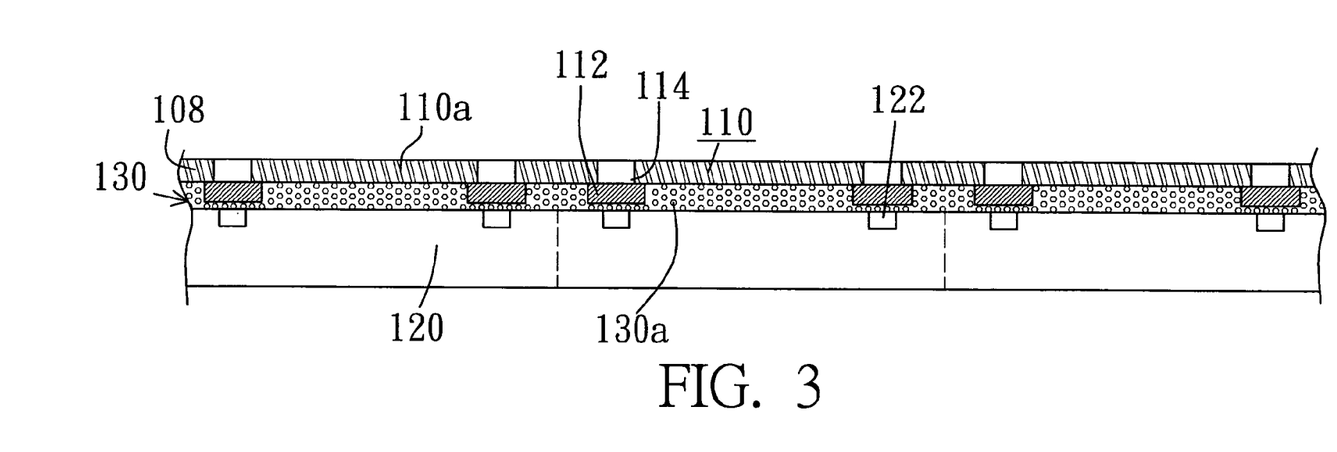

Referring to FIG. 3, a patterned circuit layer 110 is attached to the active surface of a semiconductor chip 120 through an anisotropic conductive adhesive layer 130.

Figures 11, 12:
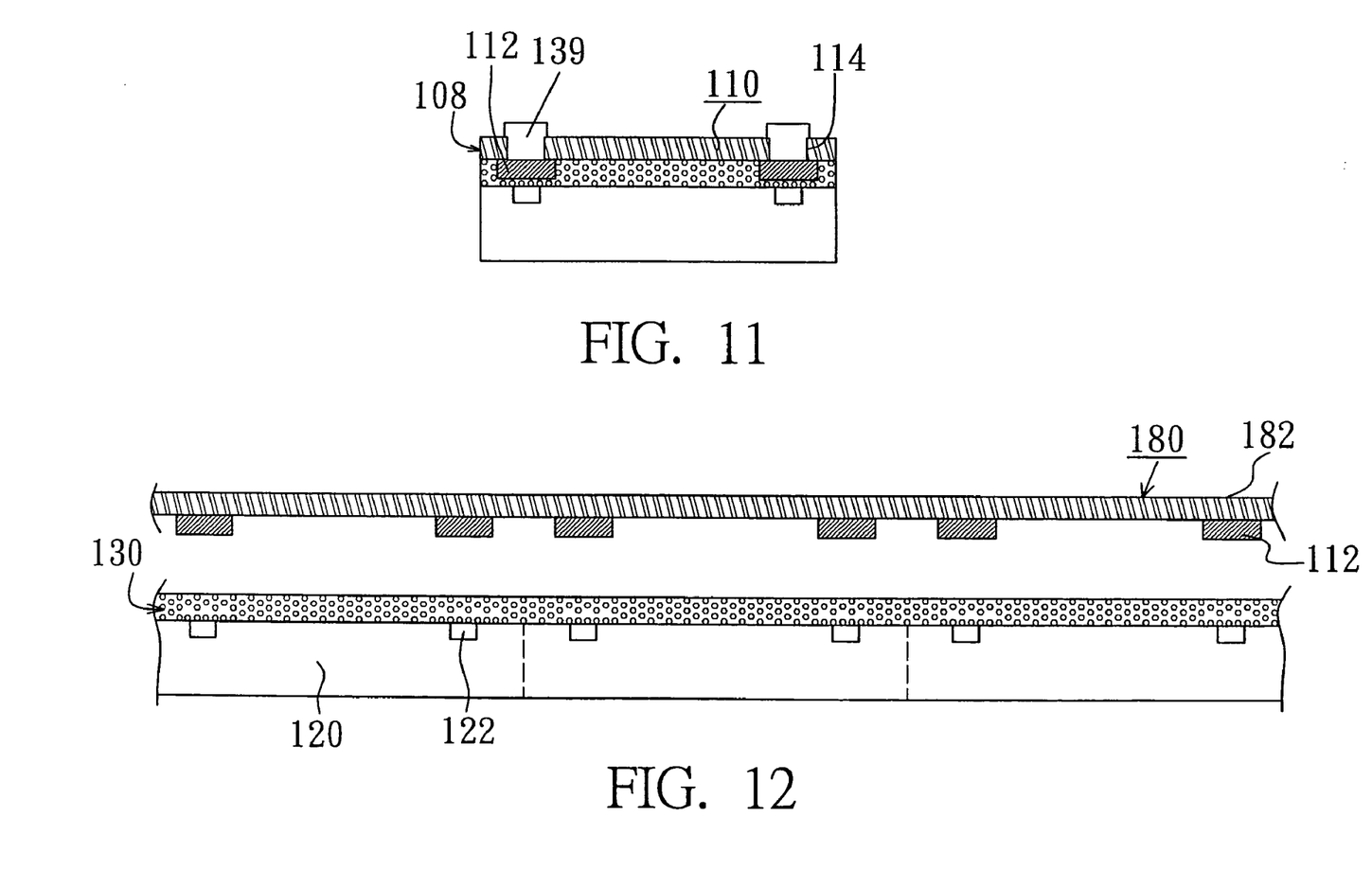
FIGS. 12 to 14 illustrate in cross-section major steps of fabrication of a patterned circuit layer of a chip scale package (CSP) according to one embodiment of the present invention.
Figure 13:
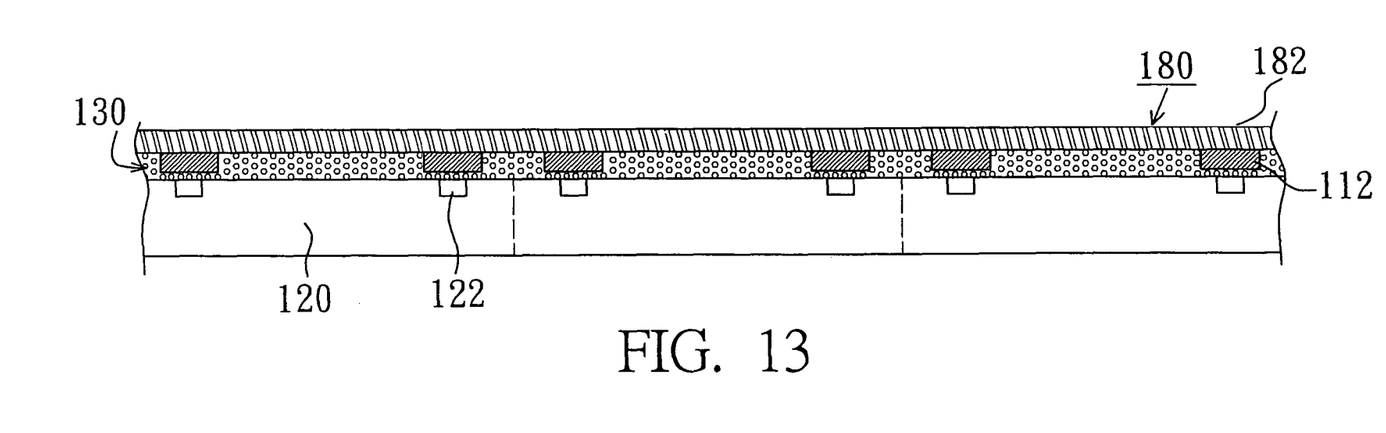
Figure 14:
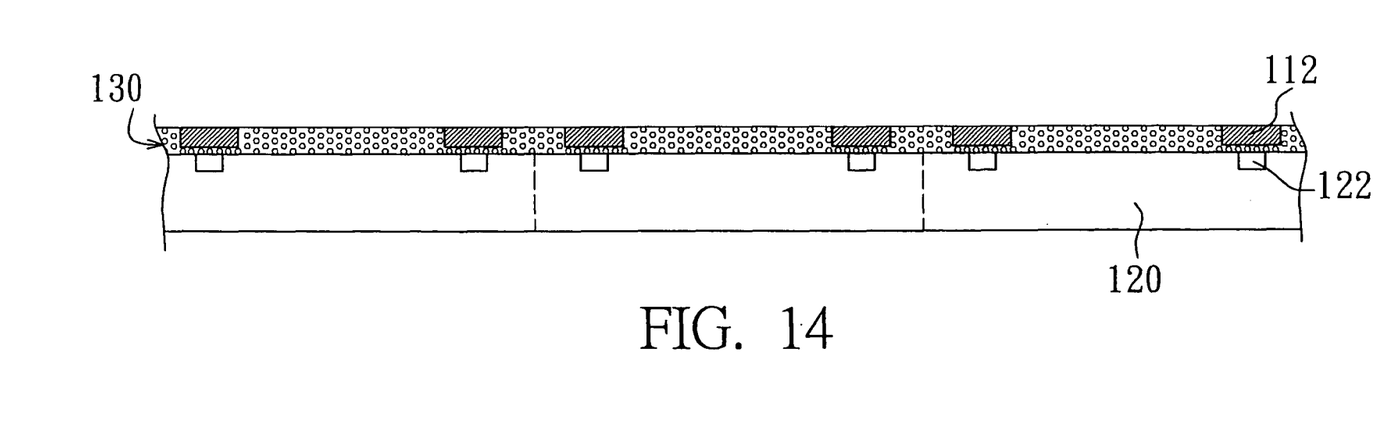

Specifically, the patterned circuit layer 110 of FIG. 3 may be formed by the manufacturing steps illustrated in FIGS. 12-14. A tape circuit 180 having a plurality of contact pads 112 on a lower surface of a tape 182 is shown in FIG. 12. After conducting a thermocompression bonding, the tape circuit 180 is adhered to the wafer through the anisotropic conductive adhesive layer 130, thereby forming a tape-circuit/wafer assembly as shown in FIG. 13. Referring to FIG. 14, the tape 182 is removed from the tape-circuit/wafer assembly thereby exposing the contact pads 112. Finally, an insulating layer 108 such as a polyimide layer or a solder mask is formed over the tape-circuit/wafer assembly, and then patterned to have a plurality of openings 114 at locations corresponding to the contact pads 112 as shown in FIG. 3.

Figure 15:
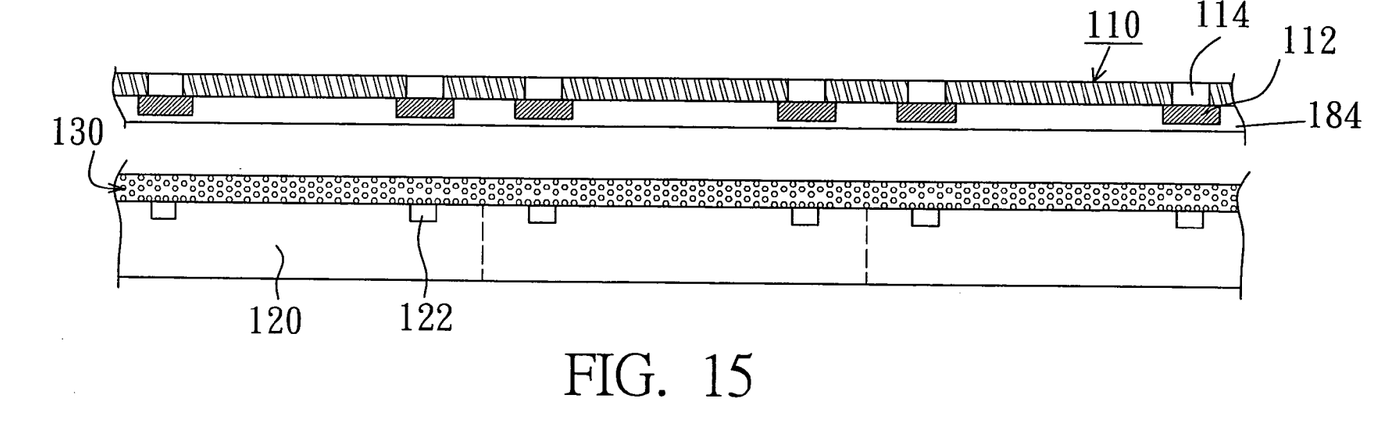
FIGS. 15 to 16 illustrate in cross-section major steps of fabrication of a patterned circuit layer of a chip scale package (CSP) according to another embodiment of the present invention.
Figure 16:
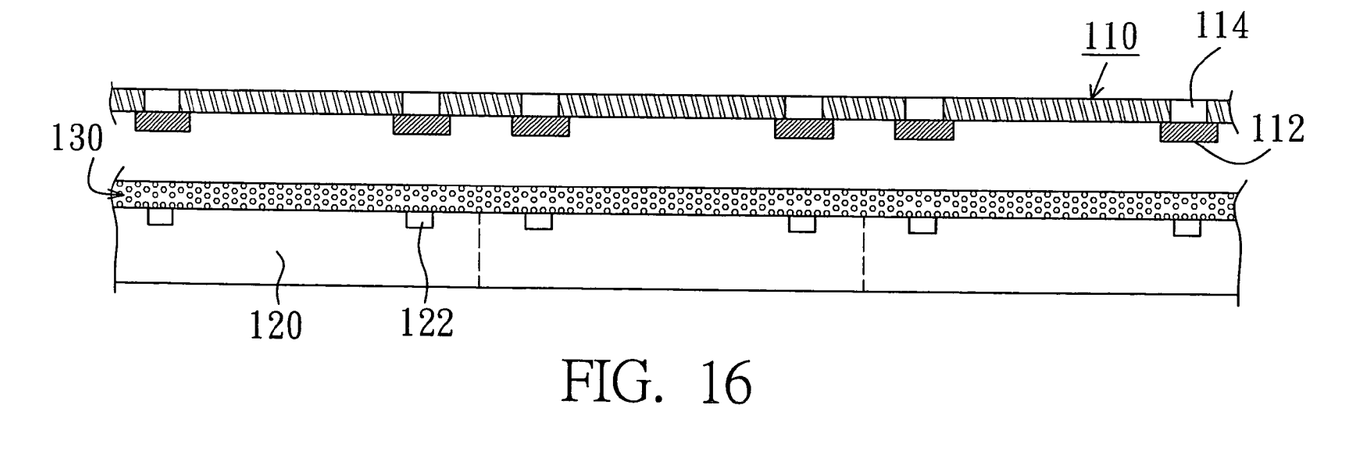

Alternatively, the patterned circuit layer 110 of FIG. 3 may be formed by the manufacturing steps illustrated in FIGS. 15-16. FIG. 15 shows a patterned circuit layer 110 with a tape 184 attached thereon. The patterned circuit layer 110 includes a plurality of contact pads 112 on a lower surface thereof and a plurality of openings 114 at locations corresponding to the contact pads 112 such that each of the contact pads 112 has a portion exposed from an upper surface of the patterned circuit layer 110 through the corresponding opening 114. As shown in FIG. 16, the tape 184 is removed from the patterned circuit layer 110 before the patterned circuit layer 110 is attached onto the wafer through the anisotropic conductive adhesive layer 130. After conducting a thermocompression bonding, the patterned circuit layer 110 is adhered to the wafer thereby forming the assembly of FIG. 3.

It could be understood that the anisotropic conductive adhesive may be thermosetting or thermoplastic. Thermal plastic anisotropic adhesives are heated to soften for using and then cooled for curing. Thermal setting anisotropic adhesives require heat curing at temperatures from 100° C.-300° C. for from several minutes to an hour or more.

Figure 4:
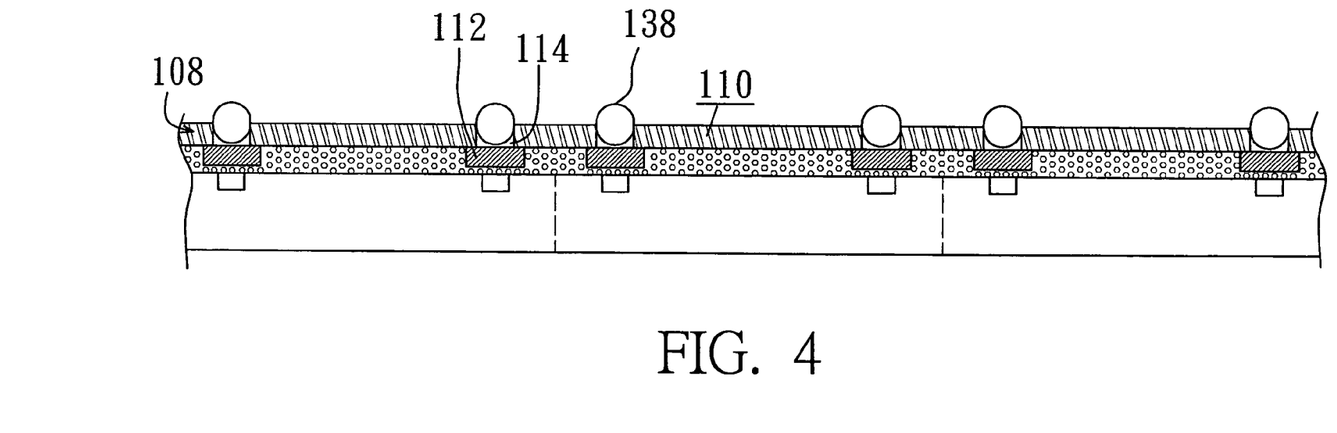

Referring to FIG. 4, a plurality of solder balls 138 are respectively placed in the openings 114. Specifically, this step may be performed by an automatic ball placing technique that makes use of a vacuum suction head to suck the solder balls and place them into the openings 114.

Thereafter, the assembly shown in FIG. 4 is transferred to a reflow oven, and then a plurality of solder bumps 140 (see FIG. 5) are formed through the reflowing process. The solder bumps 140 are used as external I/O electrodes of the finished chip scale package.

Figure 5:
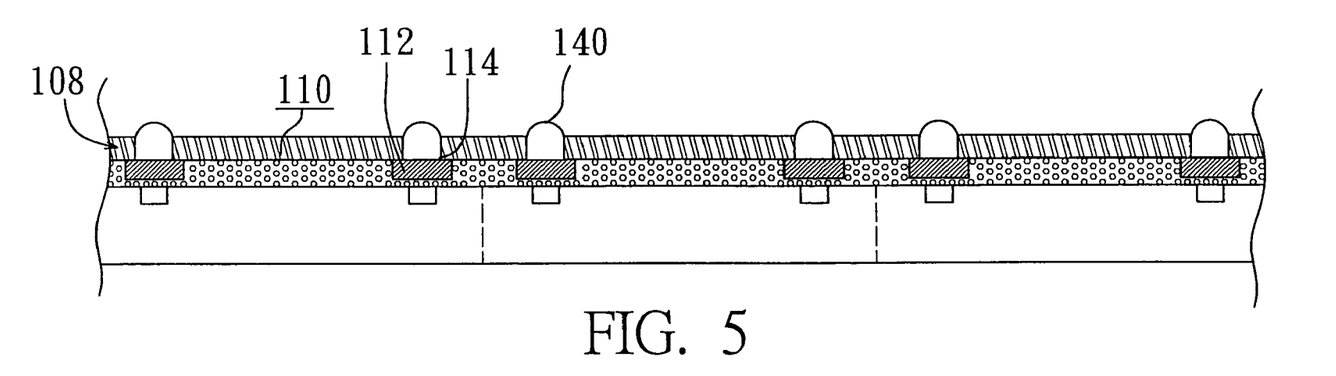
Figure 6:
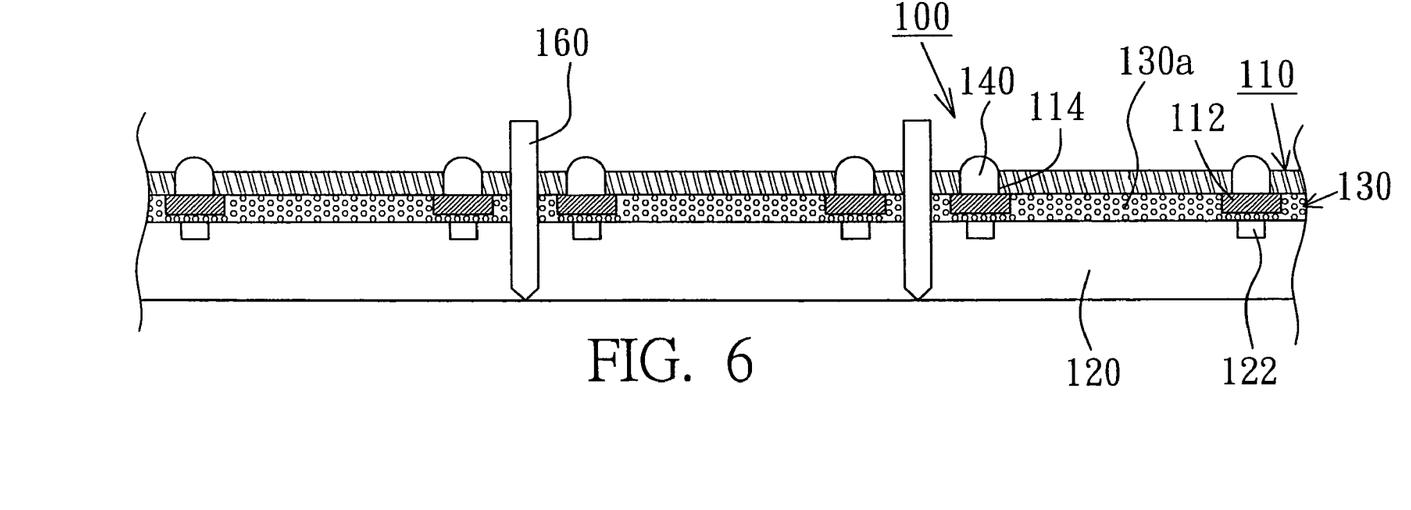

Finally, referring to FIG. 6, a cutting step is conducted by a dicing blade 160 to separate the assembly shown in FIG. 5 into individual chip scale packages 100 (see FIG. 7).

Figure 10:
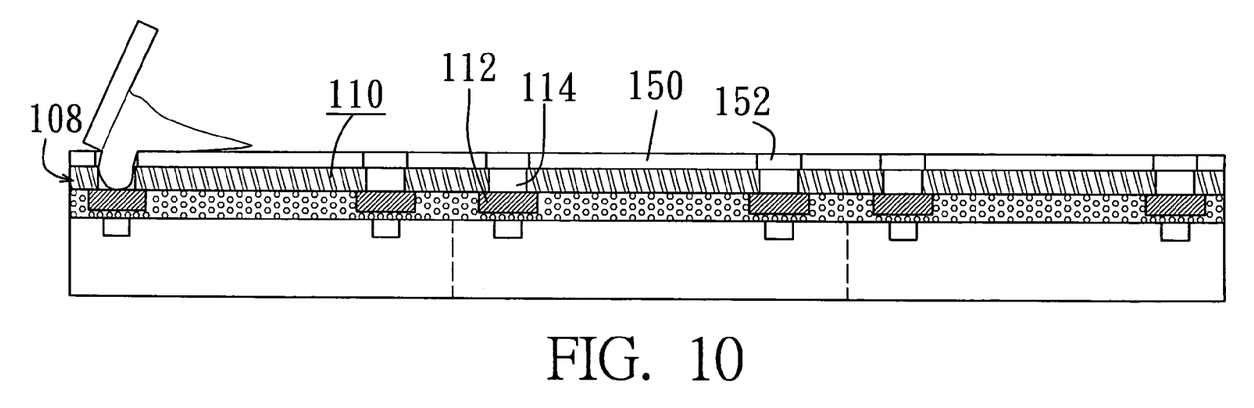
FIGS. 10 to 11 illustrate in cross-section major steps of fabrication of chip scale packages at the wafer-level according to another embodiment of the present invention.

FIGS. 10-11 illustrate a method for manufacturing chip scale packages at the wafer-level according to another embodiment of the present invention. This method is substantially identical to the method illustrated in FIGS. 1-6 with the exception that the solder bumps 140 are formed through a solder paste stencil printing step instead of the solder-ball placing step mentioned above. Specifically, as shown in FIG. 10, solder paste is screened directly into the openings 114 using a stencil 150 drilled with holes in a pattern matching the desired contact pads array. Thereafter, a plurality of column-like solder protrusions 139 (see FIG. 11) are formed after the stencil 150 is removed.

The chip-sized packages of the present invention can be mass produced easily at the wafer-level thereby significantly reducing the manufacturing cost.

FIGS. 10-11 illustrate a method for manufacturing chip scale packages at the wafer-level according to another embodiment of the present invention. This method is substantially identical to the method illustrated in FIGS. 1-6 with the exception that the solder bumps 140 are formed through a solder paste stencil printing step instead of the solder-ball placing step mentioned above. Specifically, as shown in FIG. 10, solder paste is screened directly into the openings 114 using a stencil 150 drilled with holes 152 in a pattern matching the desired contact pads array. Thereafter, a plurality of column-like solder protrusions 139 (see FIG. 11) are formed after the stencil 150 is removed.

What is claimed is:

1. A method for manufacturing chip scale packages at the wafer-level, the method comprising steps of:
   providing a tape circuit including a plurality of contact pads on a lower surface of a tape;
   providing a wafer including a plurality of semiconductor chips wherein each semiconductor chip has a plurality of bonding pads on an active surface thereof;
   forming an anisotropic conductive adhesive layer onto the active surface of the wafer;
   attaching the tape circuit onto the wafer through the anisotropic conductive adhesive layer to form a tape-circuit/wafer assembly such that the contact pads are electrically coupled to the corresponding bonding pads on the semiconductor chip;
   removing the tape from the tape-circuit/wafer assembly and exposing the contact pads;
   forming an insulating layer above the anisotropic conductive adhesive layer and over the tape-circuit/wafer assembly;
   patterning the insulating layer to form a plurality of openings at locations corresponding to the contact pads after the tape being removed;
   forming a plurality of metal bumps in the openings of the insulating layer and mounted to the contact pads; and
   conducting a cutting step to obtain individual chip scale packages.

2. The method as claimed in claim 1, wherein the contact pads are formed at locations corresponding to the bonding pads on the semiconductor chip.

3. The method as claimed in claim 2, wherein the anisotropic conductive adhesive layer is formed from an adhesive filled with a plurality of conductive particles, and the contact pads of the tape circuit are electrically coupled to the corresponding bonding pads on the semiconductor chip only through the conductive particles.

4. The method as claimed in claim 1, wherein the tape circuit includes a plurality of conductive traces each having a first end portion formed at a location corresponding to one of the bonding pads on the semiconductor chip and a second end portion serving as the contact pad.

5. The method as claimed in claim 4, wherein the anisotropic conductive adhesive layer is formed from an adhesive filled with a plurality of conductive particles, and the contact pads of the tape circuit are electrically coupled to the corresponding bonding pads on the semiconductor chip only through the conductive particles and the conductive traces.

6. The method as claimed in claim 1, wherein the metal bumps are formed by placing a plurality of solder balls in the openings of the insulating layer and then conducting a reflowing step.

7. The method as claimed in claim 1, wherein the metal bumps are formed by a solder paste stencil printing step and a reflowing step.

8. A method for manufacturing chip scale packages at the wafer-level, the method comprising steps of
   providing a patterned circuit layer with a tape attached thereon, the patterned circuit layer including a plurality of contact pads on a lower surface thereof;
   forming an insulating layer in a lower surface of the patterned circuit layer;
   patterning the insulating layer to form a plurality of openings at locations corresponding to the contact pads such that each of the contact pads has a portion exposed from an upper surface of the patterned circuit layer through the corresponding opening;
   providing a wafer including a plurality of semiconductor chips wherein each semiconductor chip has a plurality of bonding pads on an active surface thereof;
   forming an anisotropic conductive adhesive layer onto the active surface of the wafer and in a lower surface of the insulating layer;
   removing the tape from the patterned circuit layer and attaching the patterned circuit layer onto the wafer through the anisotropic conductive adhesive layer such that the contact pads of the patterned circuit layer are electrically coupled to the corresponding bonding pads on the semiconductor chip;
   forming a plurality of metal bumps in the openings of the insulating layer and mounted to the exposed portions of the contact pads of the patterned circuit layer; and
   conducting a cutting step to obtain individual chip scale packages.

9. The method as claimed in claim 8, wherein the contact pads are formed at locations corresponding to the bonding pads on the semiconductor chip.

10. The method as claimed in claim 9, wherein the anisotropic conductive adhesive layer is formed from an adhesive filled with a plurality of conductive particles, and the contact pads of the patterned circuit layer are electrically coupled to the corresponding bonding pads on the semiconductor chip only through the conductive particles.

11. The method as claimed in claim 8, wherein the patterned circuit layer includes a plurality of conductive traces each having a first end portion formed at a location corresponding to one of the bonding pads on the semiconductor chip and a second end portion serving as the contact pad.

12. The method as claimed in claim 11, wherein the anisotropic conductive adhesive layer is formed from an adhesive filled with a plurality of conductive particles, and the contact pads of the patterned circuit layer are electrically coupled to the corresponding bonding pads on the semiconductor chip only through the conductive particles and the conductive traces.

13. The method as claimed in claim 8, wherein the metal bumps are formed by placing a plurality of solder balls in the openings of the patterned circuit layer and then conducting a reflowing step.

14. The method as claimed in claim 1, wherein the metal bumps are formed by a solder paste stencil printing step and a reflowing step.

15. A method for manufacturing chip scale packages at the wafer-level, comprising steps of:
   providing a patterned circuit layer including a plurality of contact pads on a lower surface of the patterned circuit layer and a plurality of solder pads on an upper surface of the patterned circuit layer wherein the contact pads are electrically coupled to the corresponding solder pads;
   forming an insulating layer in a lower surface of the patterned circuit layer;
   patterning the insulating layer to form a plurality of openings at locations corresponding to the contact pads;
   providing a wafer including a plurality of semiconductor chips wherein each semiconductor chip has a plurality of bonding pads on an active surface thereof;
   forming an anisotropic conductive adhesive layer having a plurality of conductive particles onto the active surface of the wafer and in a lower surface of the insulating layer;
   attaching the patterned circuit layer onto the wafer through the anisotropic conductive adhesive layer such that the contact pads of the patterned circuit layer are electrically coupled to the corresponding bonding pads on the semiconductor chip only through the conductive particles;
   forming a plurality of metal bumps in the openings of the insulating layer to be mounted to the solder pads of the patterned circuit layer; and
   conducting a cutting step to obtain individual chip scale packages.

16. The method as claimed in claim 15, wherein the metal bumps are formed by a solder-ball placing step and a reflowing step.

17. The method as claimed in claim 15, wherein the metal bumps are formed by a solder paste stencil printing step and a reflowing step.

* * * * *